US006462461B1

(12) United States Patent
Puskas

(10) Patent No.: US 6,462,461 B1
(45) Date of Patent: Oct. 8, 2002

(54) CIRCUITRY TO MODIFY THE OPERATION OF ULTRASONIC GENERATORS

(76) Inventor: William L. Puskas, P.O. Box 1676, New London, NH (US) 03257-1676

( * ) Notice: Subject to any disclaimer, the term of this patent is extended or adjusted under 35 U.S.C. 154(b) by 0 days.

(21) Appl. No.: 09/609,036

(22) Filed: Jun. 30, 2000

(51) Int. Cl.[7] .................................................. H01L 41/06
(52) U.S. Cl. .................................................. 310/323.01
(58) Field of Search ............................ 310/334, 323.01; 323/209, 239; 315/291; 134/1, 17; 366/108, 116; 95/30; 96/175; 318/114; 433/119, 86

(56) References Cited

U.S. PATENT DOCUMENTS 4,023,004 A 5/1977 Burke ................. 219/10.55 B
4,027,226 A 5/1977 Studtumann ................. 321/47
4,634,957 A * 1/1987 Hollaway ................... 323/242
4,736,130 A 4/1988 Puskas ....................... 310/316
4,845,391 A 7/1989 Gulczynski ................. 307/631
5,076,854 A 12/1991 Honda et al. .................. 134/1
5,592,073 A 1/1997 Redlich ...................... 323/300
5,734,289 A 3/1998 Khudoshin .................. 327/438
5,834,871 A 11/1998 Puskas ....................... 310/316
5,861,721 A * 1/1999 Johnson ...................... 315/291
5,892,314 A 4/1999 Sager et al. ................ 310/317
5,930,946 A 8/1999 Mah ............................ 43/124
6,002,195 A 12/1999 Puskas ....................... 310/325
6,016,821 A 1/2000 Puskas ....................... 134/186
6,051,895 A 4/2000 Mercier ...................... 307/125

* cited by examiner

*Primary Examiner*—Shawn Riley
(74) *Attorney, Agent, or Firm*—The Bilicki Law Firm, P.C.

(57) ABSTRACT

An AC switch is created by switching devices to modify the output of an ultrasonic generator. The AC switch introduces a modification circuitry into and out of the output stage of the ultrasonic generator. The AC switch is placed in parallel with the modification circuitry when inserting the modification circuitry into a conduction line of the ultrasonic generator. It is placed in series when inserting the modification circuitry between two nodes of the ultrasonic generator. A control circuit is associated with the AC switch to turn on and off the ultrasonic generator, overcoming the inability of triacs to turn off power when conducting ultrasonic current. The introduction of the modification circuitry by the AC switch allows the modification of the frequency, amplitude, power, impedance and waveform of an ultrasonic generator.

95 Claims, 10 Drawing Sheets

CIRCUITRY TO MODIFY THE OPERATION OF ULTRASONIC GENERATORS

CROSS REFERENCE TO RELATED APPLICATIONS

The following U.S. Patents and pending U.S. Patent Applications are related to the present application, and hereby incorporated by reference:

U.S. application Ser. No. 08/718,945 filed Sep. 24, 1996, entitled "Apparatus and Methods for Cleaning and/or Processing Delicate Parts", which claims priority of Provisional Application Ser. No. 60/023,150 filed Aug. 5, 1996, entitled "Apparatus and Methods for Processing and Cleaning Semiconductor Wafers and Other Delicate Parts". U.S. application Ser. No. 08/718,945 issued in Nov. 10, 1998 as U.S. Pat. No. 5,834,871.

U.S. application Ser. No. 09/066,171 filed Apr. 24, 1998, entitled "Apparatus and Methods for Cleaning and/or Processing Delicate Parts", which is a continuation of U.S. Pat. No. 5,834,871 and is issued in Dec. 14, 1999 as U.S. Pat. No. 6,002,195.

U.S. application Ser. No. 09/097,374, filed Jun. 15, 1998, entitled "Systems and Methods for Ultrasonically Processing Delicate Parts", issued on Jan. 25, 2000 as U.S. Pat. No. 6,016,821, claiming priority to U.S. Provisional Patent Application Ser. No. 60/049,717 filed on Jun. 16, 1997, and entitled "Systems and Methods for Ultrasonically Processing Delicate Parts". U.S. application Ser. No. 09/097,374 is also a continuation-in-part of U.S. application Ser. No. 08/718,945, filed on Sep. 24, 1996, entitled "Apparatus and Methods for Cleaning and/or Processing Delicate Parts", which issued on Nov. 10, 1998 as U.S. Pat. No. 5,834,871.

U.S. application Ser. No. 09/066,158 filed Apr. 24, 1998, entitled "Apparatus and Methods for Cleaning and/or Processing Delicate Parts", which is a continuation-in-part of U.S. Pat. No. 5,834,871 and is issued in Jan. 30, 2001 as U.S. Pat. No. 6,181,051 B1 U.S. application Ser. No. 09/066,158 also claims priority to U.S. Provisional application 60/023,150.

U.S. application Ser. No. 09/370,302, filed Aug. 9, 1999, entitled "Probe System for Ultrasonic Processing Tank", still pending.

U.S. application Ser. No. 09/371,704, filed Aug. 9, 1999, entitled "Ultrasonic Generating Unit having a Plurality of Ultrasonic Transducers", now issued Jan. 30, 2001 as U.S. Pat. No. 6,181,052 B1.

U.S. application Ser. No. 09/370,751, filed Aug. 9, 1999, entitled "Power System for Impressing AC voltage Across a Capacitive Element", and is now issued Jan. 9, 2001 as U.S. Pat. No. 6,172,444 B1.

U.S. application Ser. No. 09/370,324, filed Aug. 9, 1999, entitled "Ultrasonic Transducer with Bias Bolt Compression Bolt", issued on Sep. 11, 2001 as U.S. Pat. No. 6,288,476 B1.

U.S. application Ser. No. 09/370,301, filed Aug. 9, 1999, entitled "Ultrasonic Transducer with Epoxy Compression Elements", now issued Jun. 5, 2001 as U.S. Pat. No. 6,242,847 B1.

U.S. application Ser. No. 09/504,567, filed Feb. 15, 2000, entitled "Multiple Frequency Cleaning System", issued on Nov. 6, 2001 as U.S. Pat. No. 6,313,565 B1.

BACKGROUND OF THE INVENTION

1. Field of the Invention

The present invention relates to an AC switch for connecting or disconnecting modification circuitry into and out of the power section of an ultrasonic generator. AC switching devices such as triacs, relays, silicon controlled rectifiers and/or transistors can be utilized.

2. Discussion of the Related Art

Ultrasonic generators are utilized in a variety of applications including but not limited to cleaning, plastic welding, cell disruption, sonochemistry, degassing, micro machining, and developing photosensitive polymers. This diversity in applications requires a versatile generator or a variety of ultrasonic generators. Frequency adjustment, amplitude control, power changes, waveform shaping, power control and output impedance selection are useful control parameters for ultrasonic generators that are designed for a variety of applications. It is therefore an object of the present invention to make ultrasonic generators more versatile by the switching of resistive, reactive, and active components.

Heretofore, different mechanisms and methods have been utilized to modify the parameters of an ultrasonic generator, like the use of linear amplifiers or drive circuits to accomplish frequency adjustment, amplitude control, power changes, waveform shaping and power control. The desired parameter(s) is formed in a low level analog or digital format and then amplified to the proper power level to drive the ultrasonic transducers. U.S. Pat. No. 5,076,854 is a typical example of this technique. The disadvantages of linear power amplifiers are that they are expensive, inefficient and physically large.

Another technique is to switch off the current to the output of the ultrasonic generator earlier for lower power and lower amplitude. This technique is known in the art to control power output and amplitude output from an ultrasonic generator. This has the disadvantage of switching losses in the semiconductor switching devices. These switching losses increase with increasing frequency, making this method even more disadvantageous as the ultrasonic frequency is increased.

Known devices and methods control of output amplitude by controlling the supply voltage to the ultrasonic generator or oscillator. U.S. Pat. No. 4,736,130 illustrates this method. The output voltage of the voltage regulator is changed as the output amplitude is also changed in the same fashion. A switching regulator can be used as the voltage regulator. Increased size and expense are disadvantages of this approach. Other known methods include the use of a linear regulator to regulate the voltage. The disadvantage of this method is inefficiency and the requirement for excess heat removal.

Other known devices have used AC switches in the output of ultrasonic systems to multiplex different transducers to an ultrasonic receiving and sending circuitry. An example is found in U.S. Pat. No. 6,051,895. This patent shows a series field effect transistor configuration used as the AC switch. Other AC switches, such as those formed from IGBTs, BJTs have been utilized. However, AC switching at the output of ultrasonic systems for the purpose of multiplexing a selected generator to a transducer array or multiplexing of a selected transducer to a generator or receiver suffers from the need for multiple generators or multiple transducers. The present invention can accomplish the same task with a single generator.

Various references demonstrate the versatility and switching abilities of triac switches. U.S. Pat. No. 5,892,314 discloses a triac switch that acts as a gate to an energy storage inductor to transfer the energy in a piezoelectric film to the energy storage inductor. In this patent the triac, however, is the active device in the generator circuit, not an AC switch used to modify the output power, amplitude, frequency or impedance of the generator circuit. U.S. Pat. No. 5,930,946 discloses a pest control device where a triac is used to generate an electromagnetic field in the AC wiring. U.S. Pat. No. 4,023,004 discloses a triac to control the power supply of a microwave oven. U.S. Pat. No. 5,592,073 discloses a circuit for controlling a triac switch. U.S. Pat. No. 5,734,289 describes another, yet different, circuit for controlling a triac switch. U.S. Pat. No. 4,027,226 shows a bipolar inverter that can use triacs as the switching mechanism. Finally, U.S. Pat. No. 4,845,391 discloses a circuit to simulate a triac switch.

In the above-identified patents the mechanisms and methods for changing the parameters of an ultrasonic generator suffer from numerous disadvantages, such as large size, inefficiency, switching losses. It is an object of the present invention to eliminate such shortcomings.

SUMMARY OF THE INVENTION

The present invention is directed to the creation of an AC switch by electronic circuitry. The AC switch as presented in this invention will exchange a modifying circuitry (which contains resistive, reactive, and active components) into and out of the power section of an ultrasonic generator. Therefore, the output of the ultrasonic generator will be modified by the modification circuitry disclosed, by way of example, herein. The AC switch is operatively connected to the modification circuitry. It switches the modification circuitry into and out of the output stage of the generator. The control circuitry is associated with the AC switch and is adapted to turn off and turn on the AC switch. The AC switch will swap resistive, reactive and active components and networks of these components into and out of the power section of ultrasonic frequency generators. The present invention provides a simple and reliable manner to increase the number of parameters and diversify the capabilities of an ultrasonic generator.

The AC switch introduces a modification circuit that is able to (1) maintain full power output from a multiple frequency ultrasonic generator as the center frequency of the generator is changed, (2) step sweep the output of an ultrasonic oscillator, and (3) vary the output power and amplitude of a non self-oscillating ultrasonic generator. A fixed frequency oscillator can be modified to accomplish certain of these functions and to sweep frequency. This is accomplished by the step sweeping and successive AC switching in of capacitors and/or inductors (i.e. modification circuitry).

This patent will suggest a number of applications in which the AC switch is created by triacs. A triac is a three terminal semiconductor, which controls current in either direction. The triac is suited to create a simple and less expensive AC switch than the use of transistors. Nevertheless, it will be obvious to those skilled in the art that other circuitry can be substituted for triacs. One example of such other circuitry, which simulates a triac, is one that includes back to back silicon-controlled rectifiers. Also, a series/parallel active device configuration or bi-directional lateral insulated gate bipolar transistor, can act as the AC switch.

The phrase “modification circuitry” as used herein is defined as resistive, reactive and active components and networks of these components. The circuitry will have two main leads and one or more control leads available for active components or networks containing active components. One of ordinary skill in the art will readily appreciate that it is possible to introduce a different value of a resistive or reactive component through the use of a transformer; therefore, in some cases a transformer winding or tap can be the part of the modification circuitry that is switched by the AC switch.

The modification circuitry is placed in parallel with an AC switch when it is required that the modification circuitry be inserted into a conduction line of the ultrasonic generator. The modification circuitry is placed in series with an AC switch when it is required that the modification circuitry be inserted between two nodes of the ultrasonic generator. When connected in series, the modification circuitry is inserted at any time in the cycle by turning on the AC switch. In the case of a parallel connection, the modification circuitry is removed from the generator when the AC switch is on. The reverse effect will happen when the AC switch is turned off. The addition of a control circuitry to the AC switch supplies turn on and off signals to the AC switch. Where the AC switch is a triac, the control circuitry will provide (1) a turn off signal to the ultrasonic generator for a period of time at least as long as the triac turn off time, (2) the turn off signal to the triac for a period of time at least as long as the triac turn off time, and (3) concurrent signals for a period of time at least as long as the triac turn off time. The use of this control circuitry is necessary due to the fact that the speed of triacs is too slow to allow them to go off when conducting an ultrasonic current.

Another embodiment of the invention includes modification circuitry capable of modifying the following parameters of the output of an ultrasonic generator: frequency; amplitude; power; impedance; and waveform. The parameter will change in accordance to the purpose of the application or generator. The modification includes at least one capacitor, one inductor, or one resistor. Finally, it can also include an active/passive network with a control circuitry adapted to control the active components in the network.

In another embodiment of the invention, a control circuitry capable of supplying a turn off signal to the AC switch for a duration D1 is illustrated. If the AC switch is a triac, the control circuitry will also supply a turn off signal D2 to the generator, where D1 and D2 are concurrent for a time equal to or greater than the triac turn off time. The same will apply if the AC switch is comprised of back to back silicon controlled rectifiers. In the case of the modification of the output frequency of an ultrasonic oscillator, the “controller” will represent the control circuit. This controller can be further modified to selectively activate or deactivate components so as to step sweep the output frequency of an oscillator.

DESCRIPTION OF THE PREFERRED EMBODIMENTS

Figure 1:
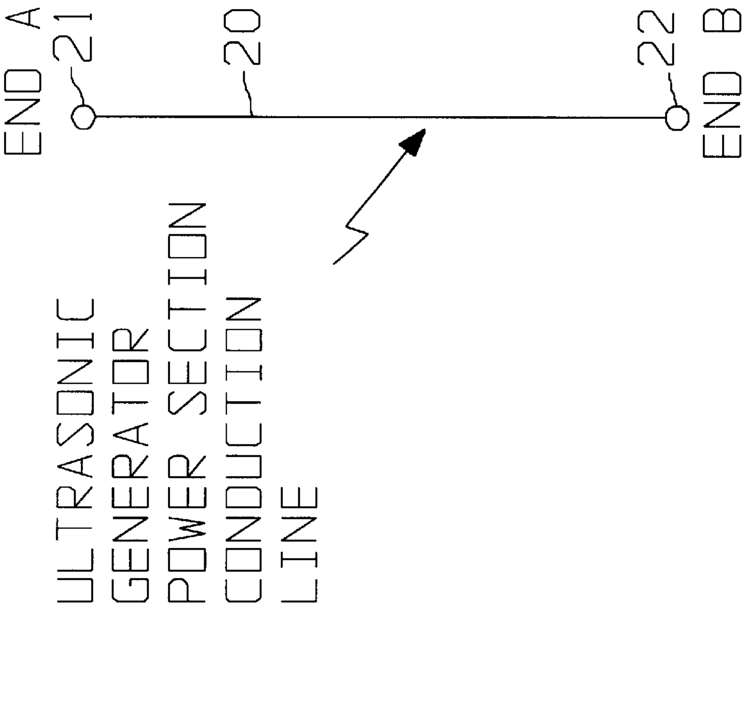
FIG. 1 shows a schematic diagram of a conduction line of an ultrasonic generator.
Figure 2:
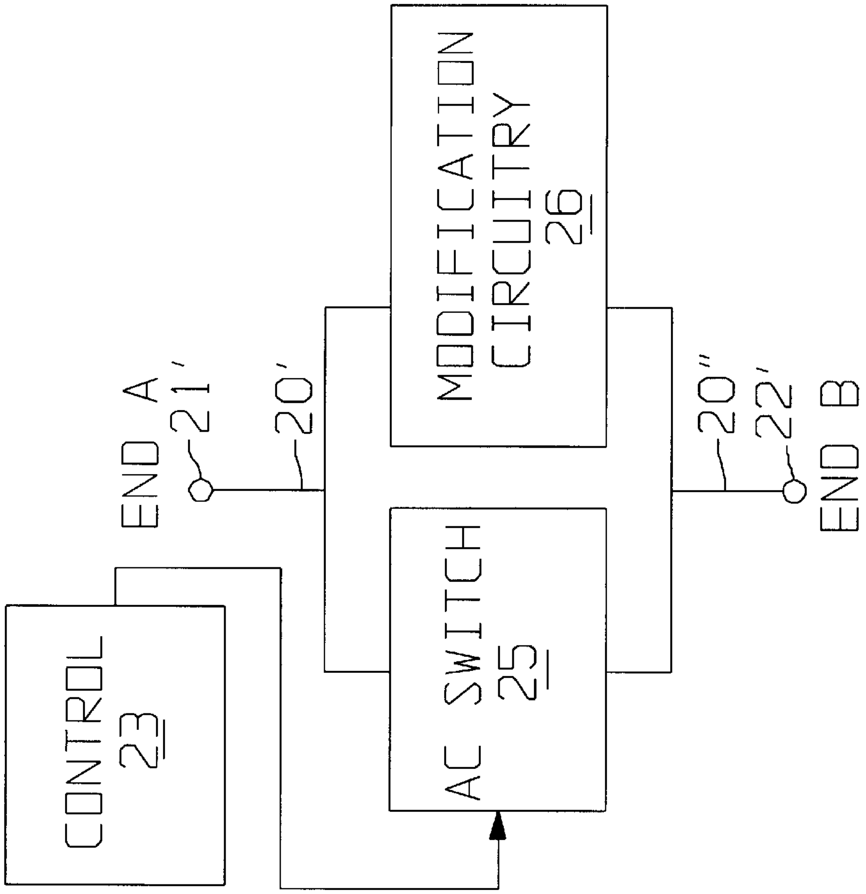
FIG. 2 shows a schematic diagram of an ultrasonic generator conduction line and the AC switch and modification circuitry, in a parallel connection. The control function of the AC switch is also shown.

Referring now to the drawings in detail, for the ease of the reader, like reference numerals designate identical or corresponding parts throughout the views depicted in the drawings. It should be noted that each embodiment of the present invention is not depicted by a drawing; nor are each of the notable applications of the present invention depicted by a drawing. FIG. 1 shows a schematic representation of a view of a conduction line 20 from a power section of an ultrasonic generator. FIG. 2 shows a box representation of a "parallel structure". As used herein, a parallel structure refers to a modification circuitry 26 and an AC switch 25 with a control 23 where the two leads of the modification circuitry 26 are connected in parallel to the AC switch 25. The "parallel structure" is connected into the conduction line 20 of the power section of an ultrasonic generator. As used herein, "power section of an ultrasonic generator", "ultrasonic generator power section" or "output of an ultrasonic generator" is defined as that output circuitry of an ultrasonic generator where the ultrasonic frequency is present. Where AC switch 25 is comprised of a triac, lead number 1 of the modification circuitry 26 is connected to triac terminal MT1. Lead number 2 of the modification circuitry 26 is connected to triac terminal MT2. The triac gate is connected to the control 23. In cases where the modification circuitry 26 contains active components, the additional control leads of these active components are also connected into the control 23. In cases where the AC switch 25 is a configuration containing more than one active component, the leads of each of the active components are driven by control 23, with proper isolation between the separate control lines where necessary.

Figure 4:
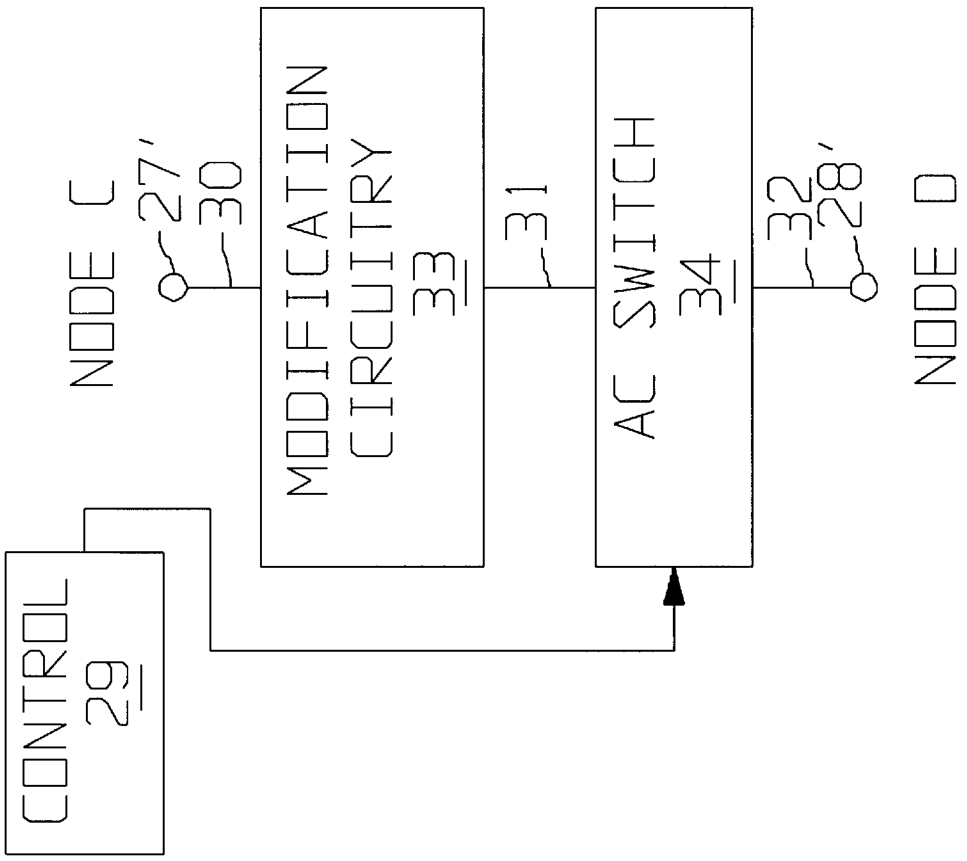
FIG. 4 shows a schematic diagram of the AC switch and modification circuitry connected in series between two nodes in the power section of an ultrasonic generator. The control function of the AC switch is also shown.
Figure 3:
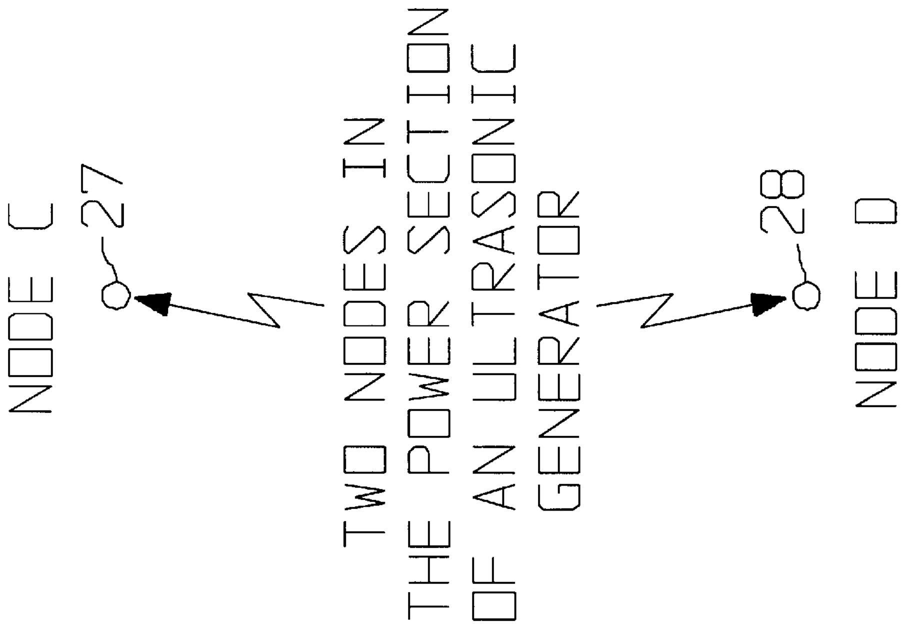
FIG. 3 shows a schematic diagram of two nodes in the power section of an ultrasonic generator.

FIG. 3 shows a schematic view of two nodes 27 and 28 in the power section of an ultrasonic generator. FIG. 4 illustrates a "series structure". As used herein, a "series structure" refers to a modification circuitry 33 and an AC switch 34 in which the two leads of the modification circuitry 33 are connected in series with the leads of an AC switch 34. This series structure is connected between two nodes in the power section of an ultrasonic generator as shown in FIG. 4. A control 29 is present to turn on and off the AC switch 34. When the AC switch 34 is comprised of a triac, the leads are the MT1 and MT2 terminals of the triac. The third lead is the gate of the triac or AC switch 34 and is connected with the control system 29. In cases where the modification circuitry 33 contains active components, the additional control leads of these active components are also connected into the control circuitry 29. In cases where the AC switch 34 is a configuration containing more than one active component, the leads of each of the active components are driven by control 29, with proper isolation between the separate control lines where necessary.

Figure 5:
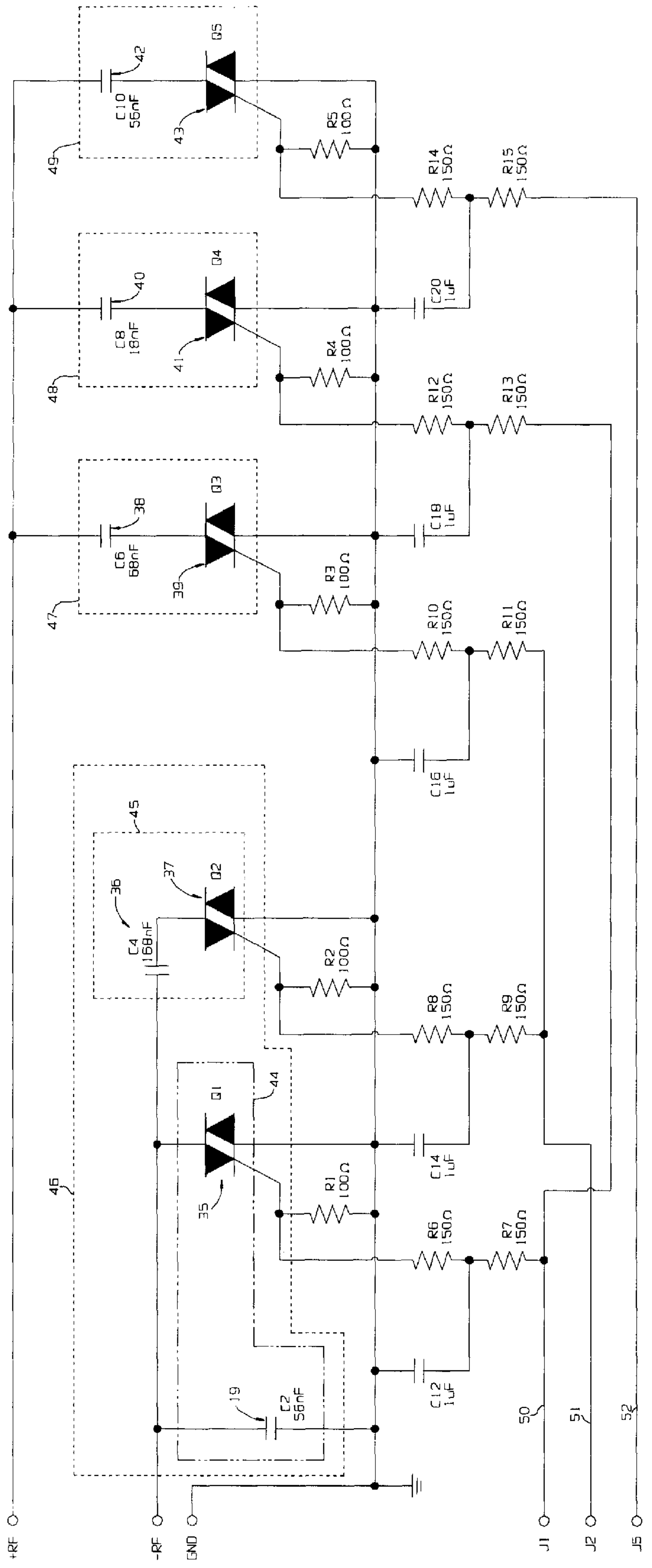
FIG. 5 shows a schematic diagram of a triac circuit employing the invention as used in the output of a multiple frequency generator.

FIG. 5 illustrates the use of a triac circuit in a preferred embodiment of the invention as depicted in FIGS. 1 and 2. The triac circuit, of FIG. 5, is used to modify the output of a multiple frequency ultrasonic generator. In particular, the modification circuitry is comprised of five capacitor passive components 19, 36, 38, 40, and 42 and associated triacs 35, 37, 39, 41, and 43. The triacs switch the modification circuitry into and out of the output stage of a multiple frequency ultrasonic generator. In a typical application, the output of an ultrasonic generator is connected between the +RF and −RF terminals, as shown in FIG. 5. The ultrasonic transducer array is connected between the +RF and GND terminals. FIG. 5 also contains a more complex parallel structure defined by the modification circuitry formed by capacitors 19 and 36 and triac 37 in parallel with the AC switch, triac 35.

The first structure 44 defined in FIG. 5 is formed by capacitor 19 and triac 35. This first structure 44 is a parallel structure and is connected in the conduction line that typically connects −RF to GND. Thus, when triac 35 is off, the capacitor 19 is inserted between −RF and GND. When triac 35 is on, capacitor 19 is shorted out which effectively connects −RF to GND. The practical effect of this first structure 44 is to place capacitor 19 in series with the transducer array when triac 35 is off and to connect the transducer array directly to the ultrasonic generator when triac 35 is on. This arrangement is useful when generating the highest frequency in a multiple frequency ultrasonic generator.

Capacitor 36 and triac 37 demarcate the second structure 45 in FIG. 5. This second structure 45 is a series structure and is connected between the nodes labeled −RF and GND. Thus, when triac 37 is on, capacitor 36 is inserted between −RF and GND. The reverse effect can be seen when triac 37 is off. When capacitor 36 is open circuited, capacitor 36 is effectively removed from the circuit. The practical effect of this second structure 45 is to place capacitor 36 in series with the transducer array when triac 37 is on. Assuming triac 35 is off, it will increase the capacitance, in series with the transducer array, to capacitors 19 and 36. This is useful when generating the second frequency (counting down from the highest) in a multiple frequency ultrasonic generator.

The above two structures can form a more complex structure 46 which is an active/passive modification circuitry comprising capacitors 19, 36 and triac 37. This modification circuitry is in parallel with triac 35 to form the third structure 46, which is a parallel structure. The practical effect of this third structure 46 is to connect the ultrasonic generator output directly to the transducer array when triac 35 is on. When triac 35 is off, it will place a capacitance in series with the transducer array (either capacitor 19 or 19 plus 36 depending on the state of triac 37). This is useful when generating lower frequencies in a multiple frequency ultrasonic generator, because when triac 35 is on, it eliminates the higher frequency structures from the system.

The fourth structure 47 present, as shown in FIG. 5, is comprised of capacitor 38 and triac 39, which form a series structure. When triac 39 is on, capacitor 38 is inserted between +RF and GND. In the case of triac 39 being off, capacitor 38 is open circuited, which effectively removes capacitor 38 from the circuit. The practical effect of this fourth structure 47 is to place capacitor 38 in parallel with the transducer array when triac 39 is on. The effect of this is to increase the capacitance in parallel with the transducer array. This is useful when generating the second frequency in a multiple frequency ultrasonic generator. It allows for the addition of the appropriate capacitance, making the power delivered at the second frequency equal to the power at the first frequency.

The fifth structure 48, as shown in FIG. 5, comprises capacitor 40 and triac 41. The fifth structure 48 has the same effect as the fourth structure, (i.e., it increases or decreases the amount of capacitance in parallel with the transducer array depending on the state of triac 41). This is useful when generating the third frequency in a multiple frequency ultrasonic generator. The power is kept equal to the first two frequencies by the increase or decrease of capacitance at the third frequency.

The sixth structure 49, as shown in FIG. 5, is comprised of capacitor 42 and triac 43. The sixth structure 49 is another series structure, which increases or decreases the capacitance in parallel with the transducer array depending of the state of triac 43. This is useful when generating the fourth frequency in a multiple frequency ultrasonic generator. It adds sufficient capacitance to make the power at the fourth frequency equal to the first three frequencies.

Figure 6A:
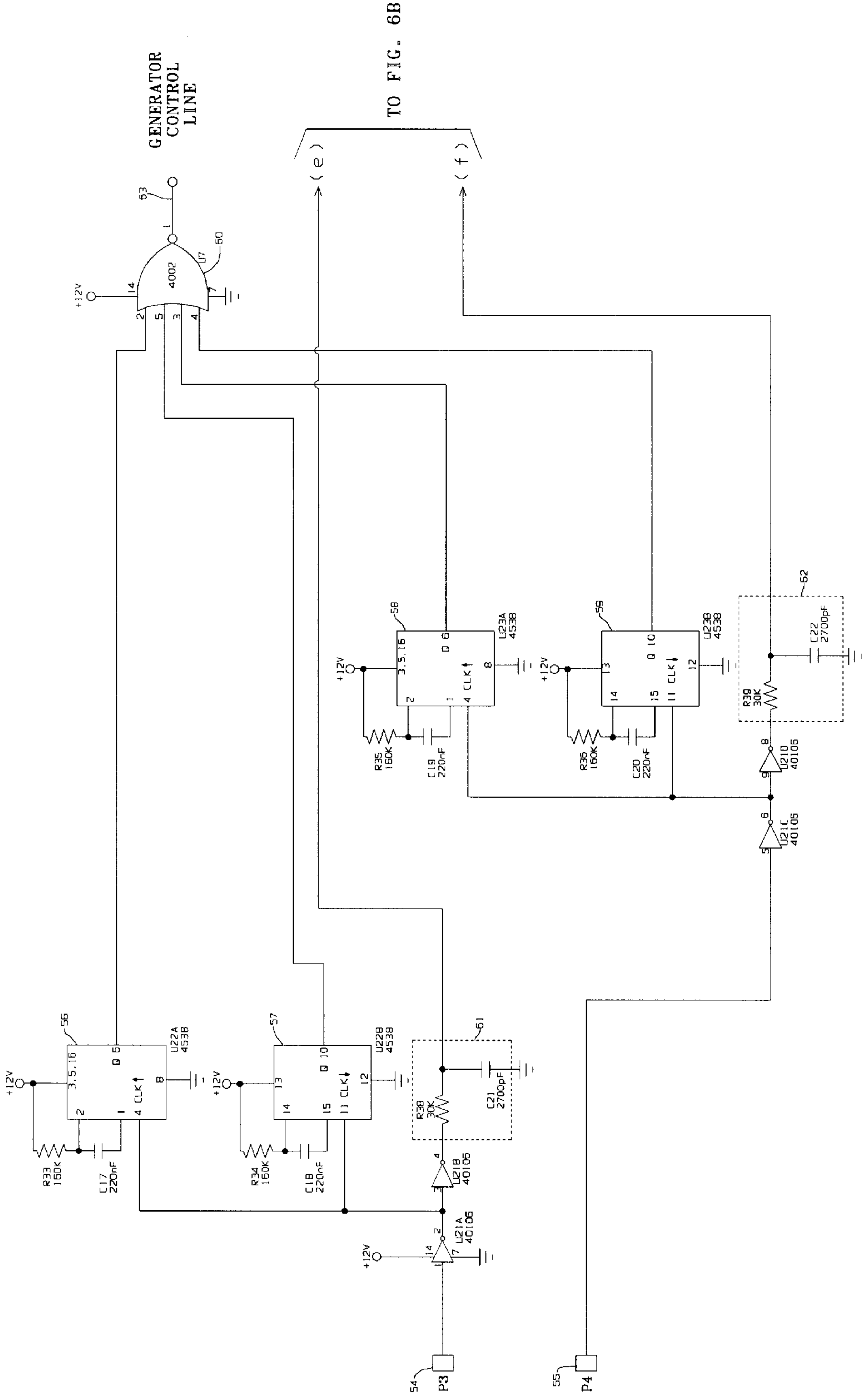
FIGS. 6A and 6B show a schematic diagram of a control circuit that produces on and off signals for the gates of the triacs in FIG. 5 and on and off signals for the frequency generation of the ultrasonic generator.
Figure 6B:
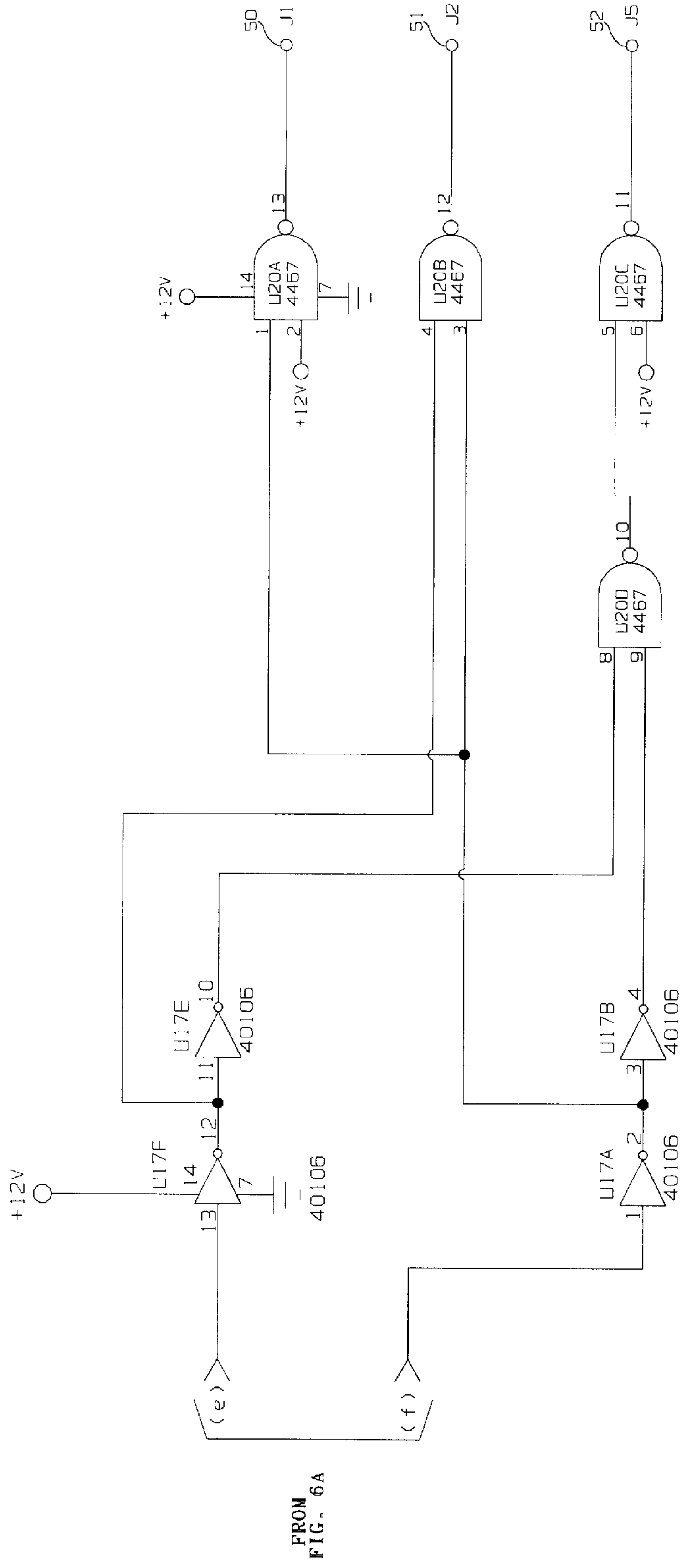
Figure 7:
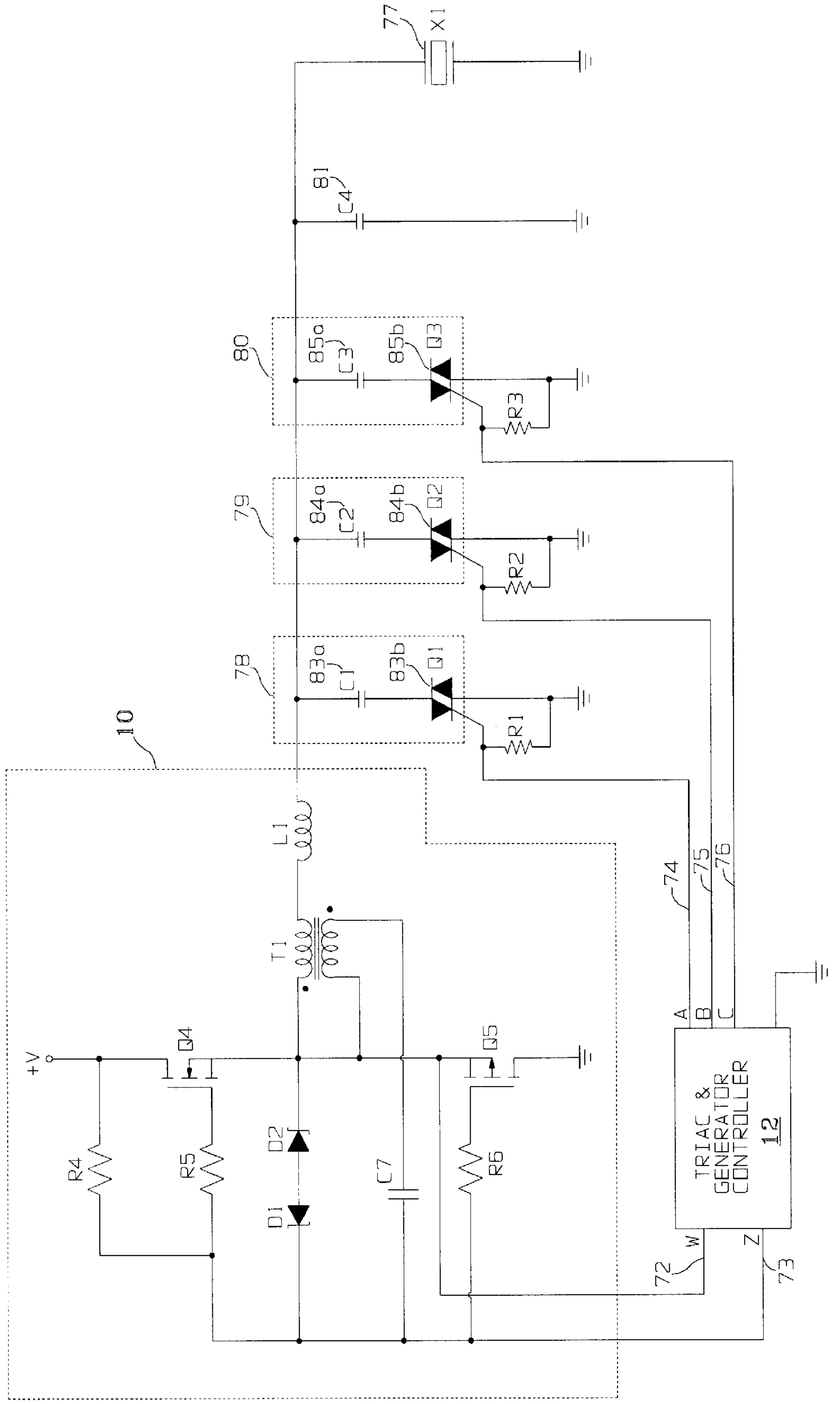
FIG. 7 shows a schematic diagram of an ultrasonic frequency oscillator with a triac network in the output to step sweep the frequency output of the oscillator.

The five gates of triacs 35 to 43 can be controlled individually, as are the gates as depicted in FIG. 7. However, as shown in FIG. 5, the gates for triacs 35 and 41 are controlled by the same signal 50. Similarly, the gates for triacs 37 and 39 are controlled by the same signal 51. Finally, the gate for triac 43 is controlled independently by signal 52. The reason for the mixture of dependent and independent control of the various gates is that, in the logic design of this particular circuit, the truth table for the gates of triacs 35 and 41 are identical. The same is true for the gates of triacs 37 and 39. The signals from 50, 51 and 52 come from the control circuitry as depicted in FIG. 6A and 6B.

The FIGS. 6A and 6B illustrate a control circuit for the circuits in FIG. 5. In FIG. 6A, the inputs 54 and 55 accept a binary code to determine the state of the triacs in FIG. 5. The logic in FIG. 6B decodes the binary code to generate the gate drive signals for the triacs in FIG. 5. The drive signal can be a positive voltage to the gate that will turn on the triac allowing the triac to conduct. The turn off signal is more complicated. To keep a triac conducting or in the on state, a current above a minimum current or the threshold current is sufficient. Therefore, to turn off a triac, the current flow has to be zero or less than the threshold current. The gates of the triac also need an off signal, usually zero volts. The "triac turn off time" as used herein is defined as the time required to accomplish the turn off of the triac with the gate at zero and with no current flow in the triac. The generator control line 63 in FIG. 6A goes low when the generator must be turned off to allow a triac to turn off (that is, when the generator is turned off, the output current decays to zero which lowers the current through the triac to below its threshold current, thus allowing the triac to turn off). The controller functions as follows. When the signal to inputs 54 or 55 is changed, one or more of the monostable multivibrators 56, 57, 58 or 59 triggers a high level output for approximately 37 milliseconds. These outputs proceed into NOR gate 60 and lower the voltage to the generator control line 63 for 37 milliseconds. The time the generator control line 63 is lowered depends on the time required for the energy stored in reactive components to decay, as well as on the application energy feedback. For example, in the case of a cleaning tank, the sound energy in the tank feeds back into the transducer, which will generate an AC ultrasonic voltage on the output stage of the generator. This feedback will typically take about 20 milliseconds to decay below the threshold of the triac. It is for this reason than the monostable multivibrators 56, 57, 58, or 59 will output a signal for approximately 37 milliseconds, allowing for the above-mentioned conditions to be met. This 37 millisecond signal has the effect of turning the generator off and therefore stops the ultrasonic current from flowing through the "on" triacs. The signal change representing the new binary code is delayed about 50 microseconds. This delay is accomplished by either a resistor and capacitor combination 61 or by resistor and capacitor combination 62 or by both. The purpose of this delay is to make sure that the generator has accomplished its turn off sequence before the binary code is decoded into the new set of triac gate signals. It is acceptable to have the zero gate signal to the triac applied at any time with respect to the generator off signal. The only mandatory condition for the generator off signal is that the triac current be below the threshold (referred to herein as D2) and that it and the triac zero gate signal (referred to herein as D1) be concurrent for a time equal to or greater than the triac turn off time. The logic in FIG. 6B decodes the signals in a way that is well known to those familiars with NAND and invert logic. The gate signals are output onto 50, 51 and 52, as shown in FIG. 5. The high level outputs provide the on signal for the respective triacs, which will be turned on, and a low level output on the gates of the other triacs.

The binary code for the logic in FIGS. 6A and 6B is (P1, P2)=(0,0) for the highest frequency, (P1, P2)=(1,0) for the second frequency, (P1, P2)=(0,1) for the third frequency, and (P1, P2)=(1,1) for the fourth frequency.

Figure 8:
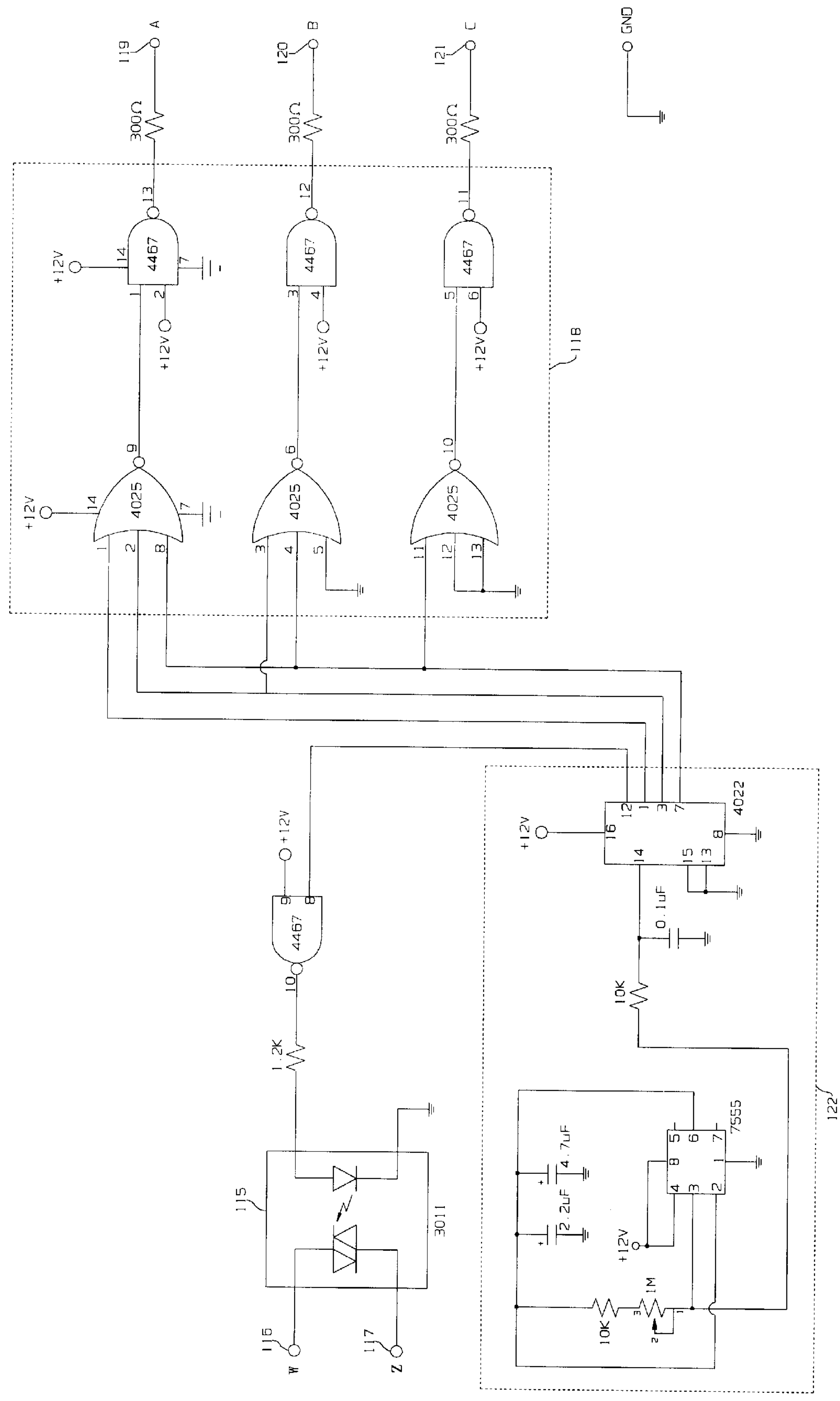
FIG. 8 shows a schematic diagram of a control circuit that produces on and off signals for the gates of the triacs in FIG. 7 and on and off signals for the oscillator in FIG. 7.

FIG. 7 depicts another preferred embodiment of this invention. The output frequency of an ultrasonic oscillator 10 is changed by the addition of three series structures (78, 79, and 80) to the output of the oscillator. The first series structure 78 consists of capacitor 83*a* and triac 83*b*. The second series structure 79 consists of capacitor 84*a* and triac 84*b*. Finally, the third series structure 80 consists of capacitor 85*a* and triac 85*b*. A controller 12 turns the oscillator 10 on and off by way of isolated lines 72 and 73. The turn off and turn on signals are applied according to the circuit being a short circuit or an open circuit. The short circuit turns the oscillator off and the open circuit turns the oscillator on. The controller 12 also turns the triacs, 83*b*, 84*b* and 85*b*, on and off by way of lines 74, 75 and 76. Lines 74, 75, 76 are functionally similar to 50, 51 and 52 from FIG. 6B of this application. The controller 12 can contain circuitry similar to FIGS. 6A and 6B, so as to provide the turn off and on signal to the triacs, as shown in FIG. 7. An alternative to control function 12 of FIG. 7 is depicted in FIG. 8.

When the capacitance of the transducer 77 is defined to be a capacitance value 77, then with all the triacs in their off state, oscillator 10 produces a frequency approximately equal to f1 where $$f1 = \frac{1}{2\pi\sqrt{(L1(81+77))}}$$

When triac 83*b* is turned on by the controller 12, thereby putting a high level on line 74 during operation of the oscillator (while maintaining the high level on line 74 or while maintaining the current flow through triac 83*b* or maintaining both of these conditions, i.e., maintaining the on state of triac 83*b*), the oscillator changes frequency from the above value to approximately f2, where $$f2 = \frac{1}{2\pi\sqrt{(L1(83a + 81 + 77))}}$$

Therefore, the oscillator frequency made a step change from frequency f1 to a lower frequency f2.

In a similar fashion, when triac 84*b* is then turned on by the controller 12, thereby putting a high level on line 75 during operation of the oscillator (while maintaining the on state of triacs 83*b* and 84*b*), the oscillator changes frequency from the above value to approximately f3, where $$f3 = \frac{1}{2\pi\sqrt{(L1(83a + 84a + 81 + 77))}}$$

Therefore, the oscillator frequency made a step change from frequency f2 to a lower frequency f3.

In a similar fashion, when triac 85*b* is then turned on by the controller 12, thereby putting a high level on line 76 during operation of the oscillator, the oscillator changes frequency from the above value to approximately f4, where $$f4 = \frac{1}{2\pi\sqrt{(L1(83a + 84a + 85a + 81 + 77))}}$$

Therefore, the oscillator frequency made a step change from frequency f3 to a lower frequency f4.

The above examples show a method to step sweep the output frequency of an oscillator from a high frequency to a lower frequency by successively turning on additional series structures comprising a capacitor modification circuitry and a triac. According to the invention, it is then necessary for the controller 12 to output a short circuit between lines 72 and 73 to turn the oscillator 10 off before the triacs 83*b*, 84*b* and 85*b* can be turned off. In a preferred embodiment, the controller 12 turns off all the triacs during this generator off time. The generator off time is timed to be at least as long as the triac turn off time plus the decay time of the sound field. Then the cycle of turning on the triacs one at a time to step sweep from the highest frequency f1 to the lowest frequency f4 can occur again. The controller then starts another oscillator off time where all the triacs are turned off and the cycle repeats. This step swinging operation can be accomplished with the control circuit, as shown in FIG. 8.

It is clear to those skilled in the art that the circuit in FIG. 7 can produce other frequency cycles. With three series structures (78, 79, 80) having unequal values for capacitors 83*a*, 84a and 85*a*, a total of eight different frequencies are possible. The four listed above and $$f5 = \frac{1}{2\pi\sqrt{(L1(84a + 81 + 77))}}$$

$$f6 = \frac{1}{2\pi\sqrt{(L1(83a + 85a + 81 + 77))}}$$

$$f7 = \frac{1}{2\pi\sqrt{(L1(84a + 85a + 81 + 77))}}$$

$$f8 = \frac{1}{2\pi\sqrt{(L1(85a + 81 + 77))}}$$

Any permutation of these eight frequencies (8! or 40,320 permutations) can be organized into a cycle by the controller 12 and supplied to the transducer. It should be noted that for any frequency change that does not require a triac to be turned off, the frequency change can be accomplished without the controller 12 turning off the oscillator. However, if any frequency change occurs where one or more triacs have to be turned off, then the controller 12 concurrently turns off the oscillator for a time at least as long as the turn off time of the triacs plus the decay time of the sound field.

FIG. 8 shows a schematic diagram of a control circuit representing the controller 12 of FIG. 7. Since in the discussion of FIG. 7 above the main functional characteristics of FIG. 8 were mentioned, only a brief description of the main elements will be discussed herein below. The controller 12 (or 101 from FIG. 9) produces on/off signals for the gates of the triacs and on/off signals for the oscillator. The signal to turn on/off the oscillator 10 is sent by way of lines 116 and 117 (these lines are equivalent to lines 72 and 73 in FIG. 7). This on/off signal is generated by element 115 when the output is a short circuit, thereby turning off oscillator 10. The component 118 decodes the signal to be output onto 119, 120 and 121 (these lines are equivalent to lines 74, 75 and 76 of FIG. 7) which is the signal sent into the triacs (83*b*, 84*b*, and 85*b*). The element 122 is in charge of sending the signals to be interpreted by 118 and 115.

Figure 9:
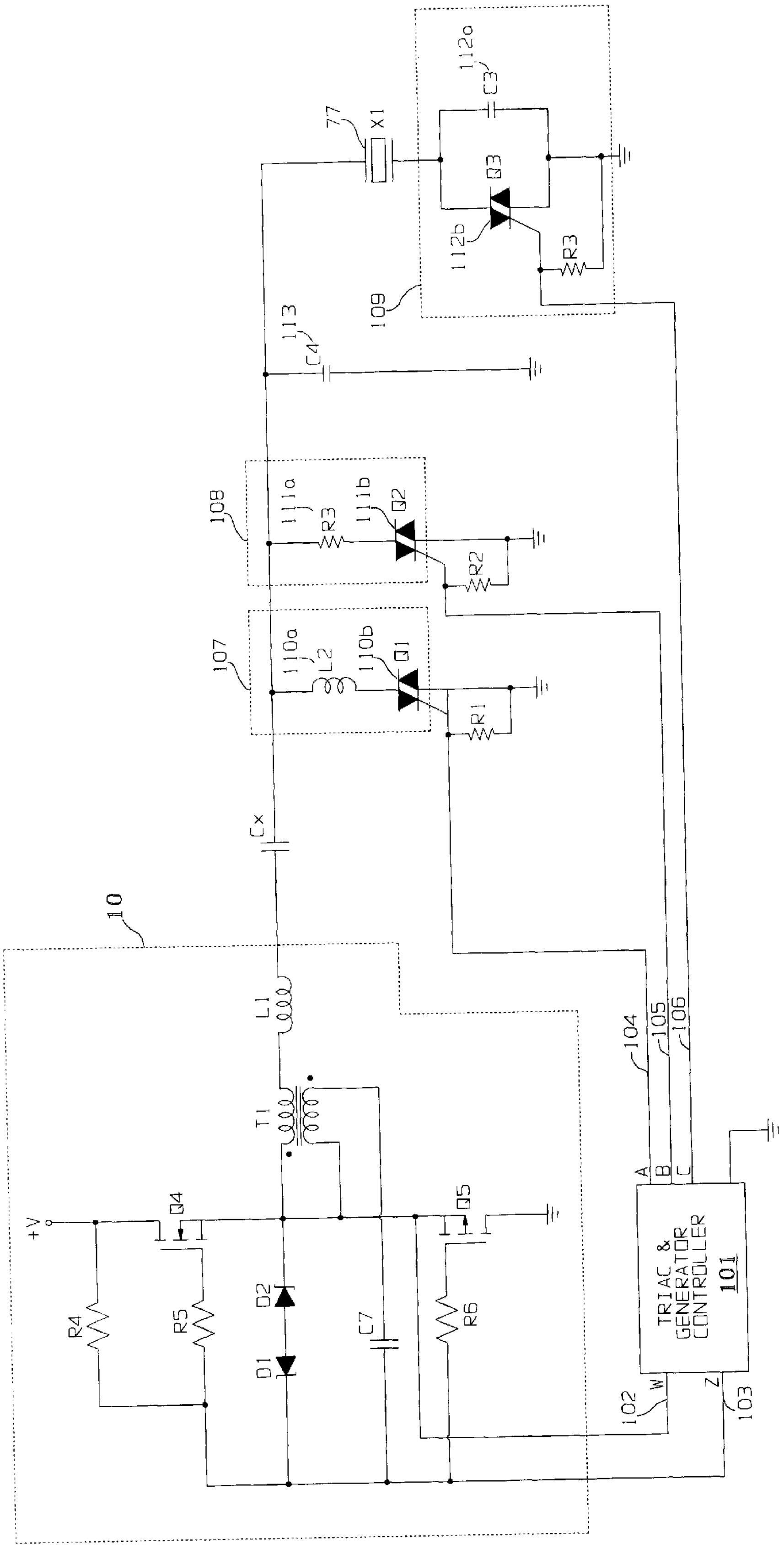
FIG. 9 shows a schematic diagram of an ultrasonic frequency oscillator with a triac network in the output using inductive, capacitive and resistive modification circuits.

FIG. 9 shows that an inductive modification circuit, a resistive modification circuit and a parallel structure can also modify an oscillator 10. The operation of FIG. 9 is similar to that described for FIG. 7. The control 101 for FIG. 9 can be similar to the control shown in FIG. 8.

With reference to FIG. 9, the series structure 107, comprising inductor 110*a* and triac 110*b*, will increase the frequency of the oscillator when triac 110*b* is turned on. The series structure 108 comprising resistor 111*a* and triac 111*b* will decrease the output amplitude and power when triac 111*b* is turned on. The parallel structure 109 comprising capacitor 112*a* and triac 112*b* will increase the frequency when triac 112*b* is turned on.

Another application of the present invention is to change the output power and amplitude of an ultrasonic generator. With some ultrasonic generators that are not of the self-oscillating type (FIG. 7 is an example of a self-oscillating type, U.S. Pat. No. 4,743,789 is an example of a non self-oscillating type) their output power and amplitude are dependent on the total amount of capacitance connected to their outputs. Connecting series structures, comprising a capacitor and a triac, as shown, for example, in FIG. 7, to the output of these non self-oscillating generators allows the power and amplitude to be changed by controlling the state of the triacs. With n series structures, 2 raised to the power n power levels and amplitude levels can be programmed into the controller.

FIGS. 5 through 9 illustrate triacs utilized as the AC switch. However, as one skilled in the are will readily appreciate, any AC switch can be used (not just triacs). There are many ways to build AC switches, such as from transistors, including bipolar junction transistors (BJTs), metal oxide semiconductor field effect transistors (MOSFETs), and insulated gate bipolar transistors (IGBTs). Additionally, suitable AC switches can be constructed from thyristors, such as gate tum-off thyristors (GTOs), silicon controlled rectifiers (SCRs), MOS controlled thyristors (MCTs), and asymmetrical silicon controlled rectifiers (ASCRs). Other AC switches or devices with forced turn off and turn on capability, such as a bidirectional lateral insulated gate bipolar transistor or a relay, can be used. Such a transistor is described in U.S. Pat. No. 5,977,569. Triacs are preferred because they are inexpensive and have only one gate lead. As is well know in the art, most of the other AC switches, including transistors and thyristors, require more than one control lead to be driven. Often these multiple drives have to be isolated from one another. Gate turn off thyristors (GTOs) can make suitable AC switch, particularly if the cost of two control leads can be justified, because GTOs can be forced off by their gate leads.

Figure 10A:
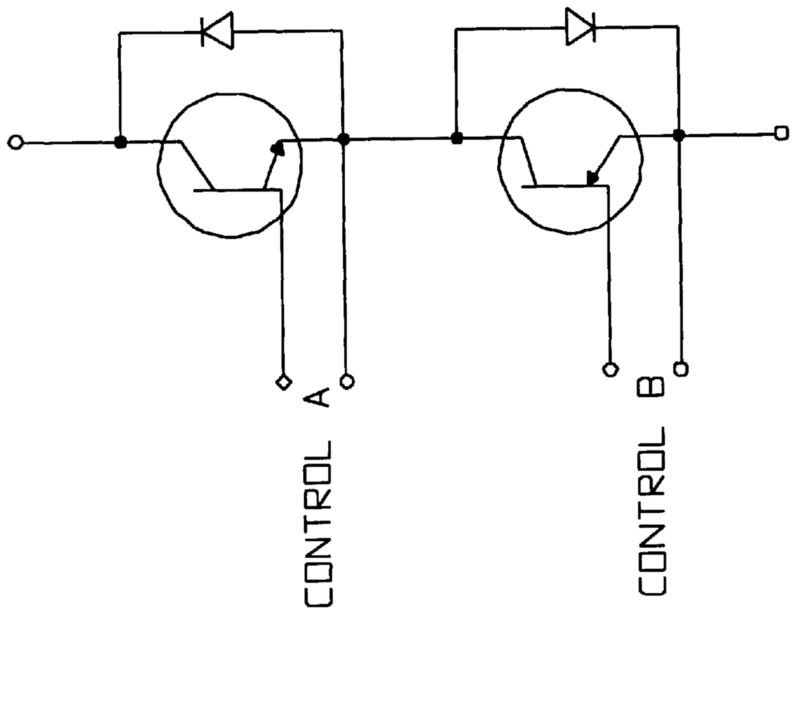
FIGS. 10A to 10C show schematic diagrams of AC switches formed from various active components.
Figure 10B:
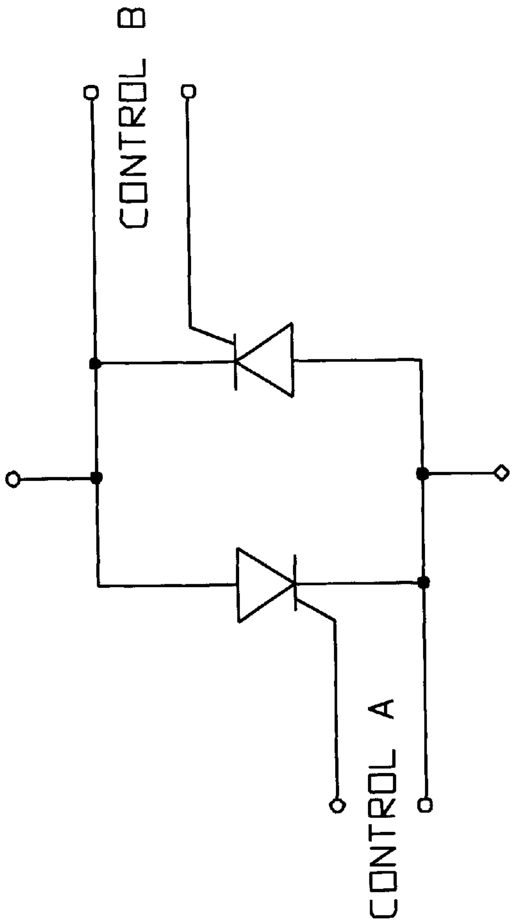
Figure 10C:
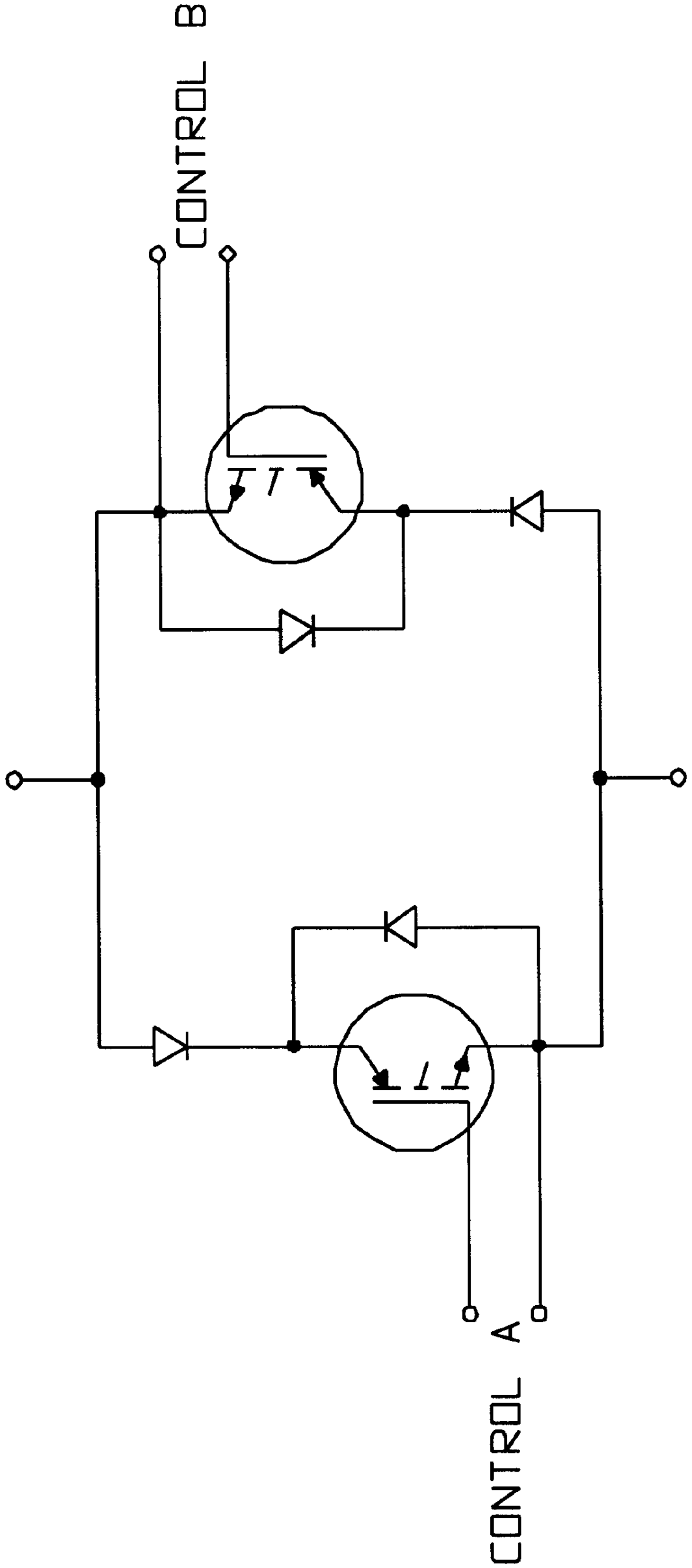

FIG. 10A shows an AC switch in a series transistor configuration where BJTs (one N channel BJT and one P channel BJT) are used. FIG. 10B shows an AC switch made in a parallel thyristor configuration where SCRs are used. This FIG. 10B circuit is commonly known as back to back SCRs. Those skilled in the art can readily appreciate the use any active components (i.e., active components that can function as a switch) either in a parallel configuration or in a series configuration to form an AC switch. Typically, diodes are needed in the series or parallel configuration to pass current or to protect the active device. FIG. 10C shows a transistor parallel configuration using IGBTs where the AC switch comprises four diodes. As used herein, the phrase "series/parallel active device configuration" means active components either in series or in parallel. The active components can be a transistor configuration or a thyristor configuration or a combination of active devices and zero or more diodes. The active devices in series or parallel configuration will form an AC switch where one active device conducts current during one half of an AC cycle and the other active device conducts current during the other half of the AC cycle.

Although the invention is described by reference to specific preferred embodiments, it is clear that variations, modifications and adaptations to this invention can be made without departing from the spirit of the invention as claimed.

What is claimed is:

1. A circuit for modifying the output of an ultrasonic generator, which comprises:

a) modification circuitry which modifies the output;

b) an AC switch, operatively connected to the modification circuitry, which switches the modification circuitry into and out of the output stage of the ultrasonic generator; and c) control circuitry, associated with the AC switch, which is adapted to turn off and turn on the AC switch.

2. The circuit according to claim 1 wherein the AC switch is a triac and wherein the control circuitry is operatively connected to the ultrasonic generator to activate the ultrasonic generator and to deactivate the ultrasonic generator when the triac is deactivated.

3. The circuit according to claim 1 wherein the AC switch is a series/parallel active device configuration.

4. The circuit according to claim 1 wherein the AC switch is an AC conducting device with forced turn off and turn on capability.

5. The circuit according to claim 1 wherein said AC switch is a triac and the control circuitry that supplies the turn off signal to the AC switch for a duration D1 is adapted to further supply a second turn off signal for a duration D2 to the ultrasonic generator, where D2 and D1 are concurrent for a time equal to or greater than the triac turn off time.

6. The circuit according to claim 1 wherein said AC switch is a pair of back to back silicon controlled rectifiers and the control circuitry that supplies the turn off signal to the AC switch for a duration D1 is adapted to supply the turn off signals to said rectifiers for the duration D1, and is adapted to further supply a third turn off signal for a duration D2 to the ultrasonic generator, where D2 and D1 are concurrent for a time equal to or greater than the turn off time of said silicon controlled rectifiers.

7. The circuit according to claim 1 wherein the AC switch is a back to back or a series gate controlled thyristor configuration.

8. The circuit according to claim 1 wherein the ultrasonic generator is a multiple frequency ultrasonic generator.

9. The circuit according to claim 1 wherein the ultrasonic generator is an oscillator.

10. The circuit according to claim 1 wherein the ultrasonic generator is a non self-oscillating ultrasonic generator.

11. The circuit according to claim 8 wherein the output of the ultrasonic generator comprises a center frequency wherein the modification circuitry maintains full power output from the ultrasonic generator as the center frequency of the ultrasonic generator is changed.

12. The circuit according to claim 1 wherein the output of the ultrasonic generator comprises an output frequency wherein the modification circuitry produces a change in the output frequency.

13. The circuit according to claim 1 wherein the output of the ultrasonic generator comprises an output amplitude, wherein the modification circuitry produces a change in the output amplitude.

14. The circuit according to claim 1 wherein the output of the ultrasonic generator comprises an output power wherein the modification circuitry produces a change in the output power.

15. The circuit according to claim 1 wherein the output of the ultrasonic generator comprises an output impedance wherein the modification circuitry produces a change in the output impedance.

16. The circuit according to claim 1 wherein the output of the ultrasonic generator comprises an output waveform wherein the modification circuitry produces a change in the output waveform.

17. The circuit according to claim 1 wherein the modification circuitry comprises at least one capacitor.

18. The circuit according to claim 1 wherein the modification circuitry comprises at least one inductor.

19. The circuit according to claim 1 wherein the modification circuitry comprises at least one resistor.

20. The circuit according to claim 1 wherein the modification circuitry comprises an active and passive network, said active and passive network comprising active components and the control circuitry is adapted to control said active components in said active and passive network.

21. A circuit for modifying the output frequency of an ultrasonic oscillator, which comprises a) at least one capacitor modification circuit, adapted to be inserted into the output stage of the oscillator, for changing the output frequency;

b) at least one AC switch, which is operatively connected to the at least one capacitor modification circuit, for switching the at least one capacitor modification circuit into and out of the output stage of the ultrasonic oscillator; and c) a controller, operatively connected to the at least one AC switch, to selectively activate and deactivate the at least one AC switch.

22. The circuit according to claim 21 wherein the at least one AC switch is a triac and the controller is operatively connected to the oscillator to selectively activate the oscillator and deactivate the oscillator when the at least one triac is deactivated.

23. The circuit according to claim 21, wherein the at least one AC switch is a series/parallel active device configuration.

24. The circuit according to claim 21 wherein the least one AC switch is a pair of back to back silicon controlled rectifiers and the controller is operatively connected to the ultrasonic oscillator to selectively activate the ultrasonic oscillator and deactivate the ultrasonic oscillator when the at least one pair of back to back silicon controlled rectifiers is deactivated.

25. The circuit according to claim 21, wherein the at least one capacitor modification circuit is comprised of a capacitor.

26. The circuit according to claim 22, wherein the controller is adapted to supply a first turn off signal for a duration D2 to the ultrasonic oscillator and a second turn off signal for a duration D1 to one or more of the triacs, such that D2 and D1 are concurrent for a time equal to or greater than the triac turn off time.

27. The circuit according to claim 26 wherein the controller is further adapted to selectively activate and deactivate the one or more triacs so as to step sweep the output frequency of the ultrasonic oscillator.

28. A circuit for modifying the output frequency of an ultrasonic oscillator, which comprises a) at least one inductor modification circuit, adapted to be inserted into the output stage of the ultrasonic oscillator, for modifying the output frequency;

b) at least one AC switch, which is operatively connected to the at least one inductor modification circuit, for switching the at least one inductor modification circuit into and out of the output stage of the ultrasonic oscillator; and c) a controller, operatively connected to the at least one AC switch, to selectively activate and deactivate the at least one AC switch.

29. The circuit according to claim 28 wherein the at least one AC switch is a triac and the controller is operatively connected to the ultrasonic oscillator to selectively activate the ultrasonic oscillator and deactivate the ultrasonic oscillator when the at least one triac is deactivated.

30. The circuit according to claim 28, wherein the at least one AC switch is a series/parallel active device configuration.

31. The circuit according to claim 28 wherein the least one AC switch is a pair of back to back silicon controlled rectifiers and the controller is operatively connected to the ultrasonic oscillator to selectively activate the ultrasonic oscillator and deactivate the ultrasonic oscillator when the at least one pair of back to back silicon controlled rectifiers is deactivated.

32. The circuit according to claim 28, wherein the at least one inductor modification circuit is comprised of an inductor.

33. The circuit according to claim 29, wherein the controller is adapted to supply a first turn off signal for a duration D2 to the ultrasonic oscillator and a second turn off signal for a duration D1 to one or more of the triacs, such that D2 and D1 are concurrent for a time equal to or greater than the triac turn off time.

34. The circuit according to claim 33 wherein the controller is further adapted to selectively activate and deactivate the one or more triacs so as to step sweep the output frequency of the ultrasonic oscillator.

35. A circuit for modifying the output of a non self-oscillating ultrasonic generator, which comprises:

a) at least one capacitor modification circuit, adapted to be inserted into the output stage of the ultrasonic generator, which modifies the output power or amplitude of the ultrasonic generator;

b) at least one AC switch, which is operatively connected to the at least one capacitor modification circuit, for switching the at least one capacitor modification circuit into and out of the output stage of the ultrasonic generator; and c) a controller, operatively connected to the at least one AC switch to selectively activate and deactivate the at least one AC switch.

36. The circuit according to claim 35 wherein the at least one AC switch is a triac and the controller is operatively connected to the ultrasonic generator to activate the ultrasonic generator and to deactivate the ultrasonic generator when the at least one triac is deactivated.

37. The circuit according to claim 35, wherein the at least one AC switch is a series/parallel active device configuration.

38. The circuit according to claim 35, wherein each of the at least one AC switch is a pair of back to back silicon controlled rectifiers.

39. The circuit according to claim 35, wherein the at least one capacitor modification circuit is comprised of at least one capacitor.

40. The circuit according to claim 36, wherein the controller is adapted to supply a first turn off signal for a duration D2 to the ultrasonic generator and a second turn off signal for a duration D1 to one or more of the triacs, such that D2 and D1 are concurrent for a time equal to or greater than the triac turn off time.

41. The circuit according to claim 35 wherein the AC switch is an AC conducting device with forced turn off and turn on capability.

42. The circuit according to claim 35 wherein the AC switch is a back to back or a series gate controlled thyristor configuration.

43. A circuit for modifying the output of a non self-oscillating ultrasonic generator, which comprises:

a) at least one inductive modification circuit, adapted to be inserted into the output stage of the ultrasonic generator, which modifies the output power or amplitude of the ultrasonic generator;

b) at least one AC switch, which is operatively connected to the at least one inductive modification circuit, for switching the at least one inductive modification circuit into and out of the output stage of the ultrasonic generator; and c) a controller, operatively connected to the at least one AC switch to selectively activate and deactivate the at least one AC switch.

44. The circuit according to claim 43 wherein the at least one AC switch is a triac and the controller is operatively connected to the ultrasonic generator to activate the ultrasonic generator and to deactivate the ultrasonic generator when the at least one triac is deactivated.

45. The circuit according to claim 43, wherein the at least one AC switch is a series/parallel active device configuration.

46. The circuit according to claim 43, wherein each of the at least one AC switch is a pair of back to back silicon controlled rectifiers.

47. The circuit according to claim 43, wherein the at least one inductive modification circuit is comprised of at least one inductor.

48. The circuit according to claim 44, wherein the controller is adapted to supply a first turn off signal for a duration D2 to the ultrasonic generator and a second turn off signal for a duration D1 to one or more of the triacs, such that D2 and D1 are concurrent for a time equal to or greater than the triac turn off time.

49. The circuit according to claim 43 wherein the AC switch is an AC conducting device with forced turn off and turn on capability.

50. The circuit according to claim 43 wherein the AC switch is a back to back gate controlled thyristor configuration.

51. The circuit according to claim 43 wherein the AC switch is a series gate controlled thyristor configuration.

52. A circuit for modifying the output of an ultrasonic generator having at least one transducer, which comprises:

a) modification circuitry which modifies the output;

b) at least one AC switch operatively connected to said modification circuitry;

c) control circuitry adapted to turn off and turn on the AC switch said control circuitry comprising:

(i) at least one binary code input;

(ii) at least one monostable multivibrator operatively connected to said at least one binary code input;

(iii) a NOR gate operatively connected to said at least one monostable multivibrator and adapted to transmit a reduced voltage to said at least one AC switch;

(iv) at least one sub-circuit comprising a resistor and a capacitor said at least one sub-circuit operatively connected to said at least one binary input and adapted to delay transmission of a signal to said at least one AC switch; and (v) at least one binary code decoder operatively connected between said at least one sub-circuit and to said at least one AC switch.

53. A circuit for modifying the output of an ultrasonic generator according to claim 52 wherein said binary code decoder is made with NAND logic units.

54. The circuit according to claim 52 wherein said modification circuit modifies the output of a multiple frequency ultrasonic generator and is located between said at least one transducer and said ultrasonic generator.

55. The circuit according to claim 54 wherein said modification circuit comprising at least one capacitor; and wherein said AC switch comprising at least one triac operatively connected to said at least one capacitor wherein said at least one capacitor and said at least one triac are connected in parallel between said at least one transducer and said ultrasonic generator.

56. The circuit according to claim 55 wherein said modification circuit further comprises a sub-circuit, said sub-circuit having a second capacitor and a second AC switch connected in series wherein said sub-circuit is connected in series with said at least one transducer when said second AC switch is on.

57. The circuit according to claim 56 where in said modification circuit further comprises a second sub-circuit said second sub-circuit having a third capacitor and a third AC switch connected in series wherein said second subcircuit is connected in parallel with said at least one transducer when said third AC switch is on.

58. The circuit according to claim 57 wherein said modification circuit further comprises a third sub-circuit said third sub-circuit comprising a fourth capacitor and a fourth AC switch in series, wherein said third subcircuit is connected in parallel with said at least one transducer when said fourth AC switch is on.

59. The circuit according to claim 58 wherein said modification circuit further comprises a fourth sub-circuit said fourth sub-circuit comprising a fifth capacitor and a fifth AC switch forming a series structure.

60. The circuit of claim 52 wherein said AC switch is a triac.

61. The circuit of claim 52 wherein said AC switch is a pair of back-to-back silicon-controlled rectifiers.

62. The circuit of claim 52 wherein said AC switch is a series/parallel active device configuration.

63. A circuit for modifying the output of an ultrasonic oscillator comprising:

a) one capacitor modification circuit having (i) a capacitor;

(ii) at least one AC switch operatively connected in series to said capacitor; and, b) a controller operatively connected to said AC switch and operatively connected to said ultrasonic oscillator.

64. The circuit according to claim 63 wherein said at least one AC switch is a triac.

65. The circuit according to claim 63 wherein said at least one AC switch is a pair of back-to-back silicon-controlled rectifiers.

66. The circuit of claim 63 wherein said AC switch is a series/parallel active device configuration.

67. The circuit of claim 63 further comprising:

a second capacitor modification circuit having a second capacitor operatively connected in series to a second AC switch, said second AC switch operatively connected to said controller.

68. The circuit according to claim 67 wherein said second AC switch is a triac.

69. The circuit according to claim 67 wherein said second AC switch is a pair of back-to-back silicon-controlled rectifiers.

70. The circuit of claim 67 wherein said second AC switch is a series/parallel active device configuration.

71. A modification circuit of claim 67 further comprising;

a third capacitor modification circuit having a third capacitor operatively connected in series to a third AC switch, said third AC switch operatively connected to said controller.

72. The circuit according to claim 71 wherein said third AC switch is a triac.

73. The circuit according to claim 71 wherein said third AC switch is a pair of back-to-back silicon-controlled rectifiers.

74. The circuit of claim 71 wherein said third AC switch is a series/parallel active device configuration.

75. A modification circuit for modifying the output frequency of an ultrasonic oscillator comprising:

a) at least one inductor modification circuit having (i) at least one inductor; and, (ii) an AC switch operatively connected in series to said at least one inductor; and, b) a controller operatively connected to each of said AC switch and said ultrasonic oscillator.

76. The circuit according to claim 75 wherein said AC switch is a triac.

77. The circuit according to claim 75 wherein said AC switch is a pair of back-to-back silicon-controlled rectifiers.

78. The circuit of claim 75 wherein said AC switch is a series/parallel active device configuration.

79. A modification circuit according to claim 75 further comprising a resistor modification circuit having at least one resistor and a second AC switch operatively connected in series with said at least one resistor, said second AC switch operatively connected to said controller, wherein said resistor modification circuit is connected in parallel with said at least one inductor modification circuit.

80. The circuit according to claim 79 wherein said second AC switch is a triac.

81. The circuit according to claim 79 wherein said second AC switch is a pair of back-to-back silicon-controlled rectifiers.

82. The circuit of claim 79 wherein said second AC switch is a series/parallel active device configuration.

83. A modification circuit according to claim 79 further comprising:

a capacitor modification circuit having, at least one capacitor and a third AC switch, said at least one capacitor and said third AC switch forming a parallel structure, wherein said third AC switch is operatively connected to said controller.

84. The circuit according to claim 83 wherein said third AC switch is a triac.

85. The circuit according to claim 83 wherein said third AC switch is a pair of back-to-back silicon controlled rectifiers.

86. The circuit of claim 83 wherein said second AC switch is a series/parallel active device configuration.

87. A modification circuit for modifying the output of a non self-oscillating ultrasonic generator comprising:

a) at least one capacitor modification circuit adapted to be inserted into the output stage of said non self-oscillating ultrasonic generator, said at least one capacitor modification circuit having at least one capacitor;

b) at least one AC switch operatively connected to said at least one capacitor modification circuit; and, c) a controller operatively connected to said at least one AC switch.

88. The circuit according to claim 87 wherein said at least one AC switch is a triac.

89. The circuit according to claim 87 wherein said at least one AC switch is a pair of back-to-back silicon controlled rectifiers.

90. A circuit for modifying the output of a non-self oscillating ultrasonic generator comprising:

a) at least one inductor modification circuit having at least one inductor;

b) at least one AC switch operatively connected to said at least one inductor modification circuit; and c) a controller operatively connected to said at least one AC switch.

91. The circuit according to claim 90 wherein said at least one AC switch is a triac.

92. The circuit according to claim 90 wherein said at least one AC switch is a series/parallel active device configuration.

93. The circuit according to claim 90 wherein each of the at least one AC switch is a pair of back-to-back silicon controlled rectifiers.

94. The circuit according to claim 90 wherein the AC switch is a back-to-back gate controlled thyristor configuration.

95. The circuit according to claim 90 wherein the AC switch is a series gate controlled thyristor configuration.

* * * * *